(12) United States Patent
Andideh et al.

(10) Patent No.: US 6,482,754 B1
(45) Date of Patent: Nov. 19, 2002

(54) METHOD OF FORMING A CARBON DOPED OXIDE LAYER ON A SUBSTRATE

(75) Inventors: Ebrahim Andideh, Portland, OR (US); Kevin L. Peterson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/867,869

(22) Filed: May 29, 2001

(51) Int. Cl.[7] .............................................. H01L 21/31
(52) U.S. Cl. ...................... 438/780; 438/485; 438/758; 438/770
(58) Field of Search ............................... 438/758, 780, 438/787, 485

(56) References Cited

U.S. PATENT DOCUMENTS

| | | | | |
|---|---|---|---|---|
| 5,872,401 A | | 2/1999 | Huff et al. ................... | 257/758 |
| 6,068,884 A | * | 5/2000 | Rose et al. ............... | 427/255.6 |
| 6,077,764 A | * | 6/2000 | Sugiarto et al. ............ | 438/597 |
| 6,147,009 A | * | 11/2000 | Grill et al. .................. | 438/780 |
| 6,211,096 B1 | * | 4/2001 | Alluman et al. ............ | 438/787 |
| 6,331,494 B1 | * | 12/2001 | Olson et al. ................ | 438/770 |

* cited by examiner

*Primary Examiner*—David Nelms
*Assistant Examiner*—Thao P Le
(74) *Attorney, Agent, or Firm*—Mark V. Seeley

(57) ABSTRACT

A method of forming a carbon doped oxide layer on a substrate is described. That method comprises introducing into a chemical vapor deposition apparatus a precursor gas that is selected from those having the formula $(CH_3)_x Si(OCH3)_{4-x}$. Simultaneously, a background gas, oxygen and nitrogen are introduced into the chemical vapor deposition apparatus. That apparatus is then operated under conditions that cause a carbon doped oxide layer to form on the substrate.

15 Claims, 1 Drawing Sheet

METHOD OF FORMING A CARBON DOPED OXIDE LAYER ON A SUBSTRATE

FIELD OF THE INVENTION

The present invention relates to a method of forming a carbon doped oxide layer on a substrate, when making a semiconductor device.

BACKGROUND OF THE INVENTION

Semiconductor devices include metal layers that are insulated from each other by dielectric layers. As device features shrink, reducing the distance between the metal layers and between metal lines on each layer, capacitance increases. To address this problem, insulating materials that have a relatively low dielectric constant are being used in place of silicon dioxide to form the dielectric layer that separates the metal lines.

A material that may be used to form such a low k dielectric layer is carbon doped oxide ("CDO"). Using this material instead of silicon dioxide to separate metal lines may yield a device having reduced propagation delay, crosstalk noise and power dissipation. A CDO layer may be deposited on a substrate using a plasma enhanced chemical vapor deposition ("PECVD") process. When using such a process to form such a layer, gases that provide a source of silicon, oxygen, and carbon must be fed into a PECVD reactor. Examples of such gases include those having the formula $(CH_3)_xSi(OCH3)_{4-x}$, e.g., tetramethoxysilane, methyltrimethoxysilane, dimethyldimethoxysilane, and trimethylmethoxysilane. A background gas, e.g., an inert gas such as helium, may be fed into the reactor at the same time. That reactor may then be operated at conventional pressures, temperatures, RF and power for a time sufficient to deposit a CDO layer of the desired thickness onto the substrate.

Although processes that use $(CH_3)_xSi(OCH3)_{4-x}$ precursors to form CDO layers may produce layers that have a dielectric constant that is less than 3.0, those processes generate those layers at a relatively low deposition rate. Accordingly, there is a need for an improved process for making a CDO insulating layer. There is a need for such a process that generates a CDO layer from a $(CH_3)_xSi(OCH3)_{4-x}$ precursor at an increased deposition rate. The method of the present invention provides such a process.

DETAILED DESCRIPTION OF THE PRESENT INVENTION

A method is described for forming a carbon doped oxide layer on a substrate. That method comprises introducing into a chemical vapor deposition apparatus a precursor gas that is selected from the group consisting of gases that have the formula $(CH_3)_xSi(OCH3)_{4-x}$. Simultaneously, a background gas, oxygen and nitrogen are introduced into the chemical vapor deposition apparatus, which is then operated under conditions that cause a carbon doped oxide layer to form on the substrate.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1:
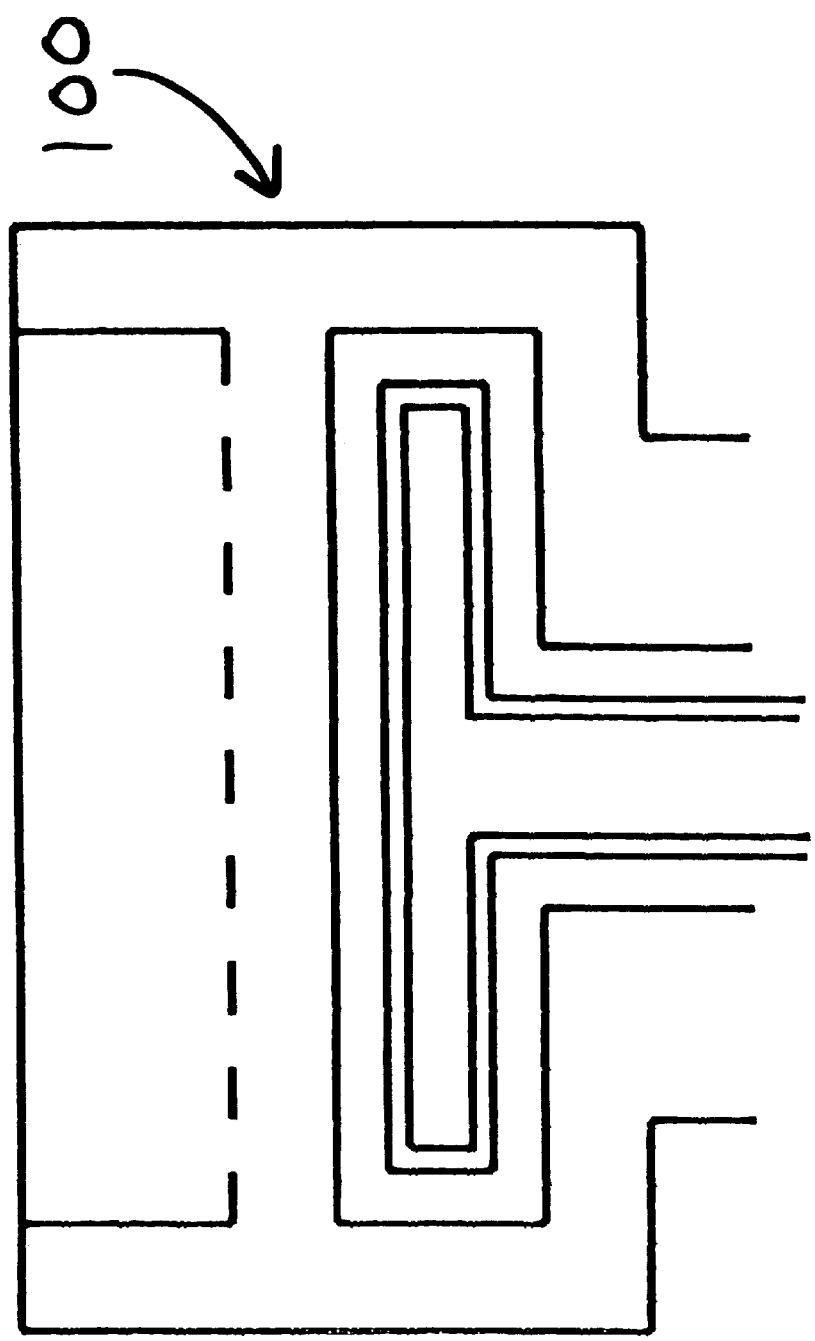
FIG. 1 provides a schematic representation of a CVD chamber for a PECVD reactor.

In the method of the present invention, a substrate, e.g., a silicon wafer upon which various conducting and insulating layers may have been formed, is placed in a chemical vapor deposition apparatus—preferably a PECVD reactor, e.g., PECVD reactor 100 illustrated in FIG. 1. To form a CDO layer on such a substrate, in accordance with the method of the present invention, gases that provide a source of carbon, silicon, and oxygen are introduced into reactor 100 in the conventional manner.

Gases that may provide a source of these elements include those that have the formula $(CH_3)_xSi(OCH3)_{4-x}$. Such gases include those that contain tetramethoxysilane, methyltrimethoxysilane, dimethyldimethoxysilane, and/or trimethylmethoxysilane. A particularly preferred precursor gas is dimethyldimethoxysilane. Note that while these substances are introduced into the reactor as gases, they may be liquids at standard temperature and pressure.

At the same time the gas that provides this source of silicon, carbon, and oxygen is fed into the reactor, a background gas, e.g., an inert gas such as helium, is fed into the reactor. In the method of the present invention, oxygen and nitrogen are also introduced into the reactor. These gases may be introduced at the following flow rates:

| | |
|---|---:|
| Precursor gas flow rate | 90–200 sccm |
| Background gas flow rate | 20–200 sccm |
| Oxygen gas flow rate | 1–20 sccm |
| Nitrogen gas flow rate | 15–300 sccm |

Although these gases are preferably introduced into the reactor at the flow rates specified above, they may, of course, be fed into the reactor at flow rates that fall outside the indicated ranges, without departing from the spirit and scope of the present invention. Those gases may be introduced into reactor 100 at conventional temperatures and pressures. Optimal operating conditions may, of course, depend upon the composition of the gas streams fed into the reactor, the type of reactor used, and the desired properties for the resulting CDO layer. A CDO layer with acceptable properties may be formed by maintaining the reactor pressure between about 2.0 and about 10.0 Torr (more preferably between about 3.0 and about 6.0 Torr), the susceptor temperature between about 3500° C. and about 450° C., and the electrode spacing at between about 15 and about 50 mm (more preferably between about 24 and about 26 mm). To generate a plasma from such a mixture of gases, RF energy is applied—preferably at standard frequencies and at between about 1,600 and about 1,800 watts.

Figure 2:
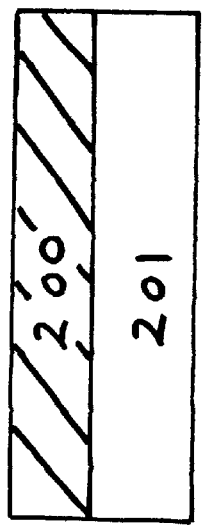
FIG. 2 represents a cross-section of a structure that includes a CDO layer deposited on a substrate, which may be generated when forming a semiconductor device.

In a particularly preferred embodiment of the present invention, oxygen and nitrogen are introduced into the reactor such that they constitute, in combination, less than about 5% of the total gas flow. For optimum results, the nitrogen and oxygen should be fed into the reactor at a flow rate ratio that is between about 1:1 and about 20:1. Feeding into reactor 100 this combination of precursor and background gases along with oxygen and nitrogen, under the above specified operating conditions, should cause CDO layer 200 to form on substrate 201 (as illustrated in FIG. 2) such that CDO layer 200 has a dielectric constant that is less than or equal to about 3.0.

The process of the present invention may enable the generation of a CDO layer that has a slightly lower dielectric constant, when compared to the dielectric constant of CDO layers made from processes that apply a $(CH_3)_xSi(OCH3)_{4-x}$ precursor gas without oxygen and nitrogen. In addition, the process of the present invention enables a CDO layer to be deposited on a substrate at a rate that exceeds about 7,000 angstroms per minute. Increasing that deposition rate enhances the manufacturability of processes for making semiconductor devices that include CDO insulating layers.

Although the foregoing description has specified certain steps, materials, and equipment that may be used in the above described method for forming a CDO layer on a substrate, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming a carbon doped oxide layer on a substrate comprising:

introducing into a chemical vapor deposition apparatus a precursor gas that is selected from the group consisting of gases that have the formula $(CH_3)_xSi(OCH3)_{4-x}$;

simultaneously introducing a background gas, oxygen and nitrogen into the chemical vapor deposition apparatus, the oxygen and nitrogen introduced into the apparatus constituting, in combination, less than about 5% of the total gas flow; then operating the apparatus under conditions that cause a carbon doped oxide layer to form on the substrate.

2. The method of claim 1 wherein the chemical vapor deposition apparatus is a plasma enhanced chemical vapor deposition reactor.

3. The method of claim 2 wherein the resulting carbon doped oxide has a dielectric constant that is less than or equal to about 3.0.

4. The method of claim 3 wherein the precursor gas is selected from the group consisting of tetramethoxysilane, methyltrimethoxysilane, dimethyidimethoxysilane, and trimethylmethoxysilane.

5. The method of claim 4 wherein the background gas comprises an inert gas.

6. The method of claim 5 wherein the background gas comprises helium and further comprising:

introducing the precursor gas into the plasma enhanced chemical vapor deposition reactor at a rate of between about 90 and about 200 sccm; and introducing the background gas into the plasma enhanced chemical vapor deposition reactor at a rate of between about 20 and about 200 sccm.

7. The method of claim 6 wherein nitrogen and oxygen are introduced into the plasma enhanced chemical vapor deposition reactor at a flow rate ratio that is between about 1:1 and about 20:1.

8. The method of claim 7 wherein the carbon doped oxide is deposited on the substrate at a rate that exceeds about 7,000 angstroms per minute.

9. A method of forming a semiconductor device comprising:

forming on a substrate a carbon doped oxide layer by introducing into a plasma enhanced chemical vapor deposition reactor a precursor gas that is selected from the group consisting of tetramethoxysilane, methyltrimethoxysilane, dimethyldimethoxysilane, and trimethylmethoxysilane;

simultaneously introducing a background gas, oxygen and nitrogen into the plasma enhanced chemical vapor deposition reactor, the oxygen and nitrogen introduced into the reactor constituting, in combination, less than about 5% of the total gas flow; then operating the reactor under conditions that cause a carbon doped oxide layer to form on the substrate at a rate that exceeds about 7,000 angstroms per minute.

10. The method of claim 9 wherein the background gas comprises helium, which is added to the nitrogen and oxygen that is fed into the reactor.

11. The method of claim 10 further comprising:

introducing the precursor gas into the plasma enhanced chemical vapor deposition reactor at a rate of between about 90 and about 200 sccm; and introducing the background gas into the plasma enhanced chemical vapor deposition reactor at a rate of between about 20 and about 200 sccm.

12. The method of claim 11 wherein nitrogen and oxygen are introduced into the plasma enhanced chemical vapor deposition reactor at a flow rate ratio that is between about 1:1 and about 20:1.

13. A method of forming a semiconductor device comprising:

forming on a substrate a carbon doped oxide layer by introducing into a plasma enhanced chemical vapor deposition reactor at a rate of between about 90 and about 200 sccm a precursor gas that is selected from the group consisting of tetramethoxysilane, methyltrimethoxysilane, dimethyldimethoxysilane, and trimethylmethoxysilane;

simultaneously introducing helium at a rate of between about 20 and about 200 sccm, oxygen and nitrogen into the plasma enhanced chemical vapor deposition reactor, the oxygen and nitrogen introduced into the reactor constituting, in combination, less than about 5% of the total gas flow; then operating the reactor under conditions that cause a carbon doped oxide layer to form on the substrate.

14. The method of claim 13 wherein nitrogen and oxygen are introduced into the plasma enhanced chemical vapor deposition reactor at a flow rate ratio that is between about 1:1 and about 20:1.

15. The method of claim 14 wherein the carbon doped oxide is deposited at a rate that exceeds about 7,000 angstroms per minute.

* * * * *

UNITED STATES PATENT AND TRADEMARK OFFICE
CERTIFICATE OF CORRECTION

PATENT NO.    : 6,482,754 B1
DATED         : November 19, 2002
INVENTOR(S)   : Andideh et al.

It is certified that error appears in the above-identified patent and that said Letters Patent is hereby corrected as shown below:

Column 2,
Line 48, delete "3500º", insert -- 350º --.

Signed and Sealed this

Twenty-fifth Day of March, 2003

JAMES E. ROGAN
*Director of the United States Patent and Trademark Office*